(12) United States Patent
Perner et al.

(10) Patent No.: US 6,901,005 B2
(45) Date of Patent: May 31, 2005

(54) METHOD AND SYSTEM READING MAGNETIC MEMORY

(75) Inventors: Frederick A. Perner, Palo Alto, CA (US); Kenneth K. Smith, Boise, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 76 days.

(21) Appl. No.: 10/649,752

(22) Filed: Aug. 27, 2003

(65) Prior Publication Data

US 2005/0047201 A1 Mar. 3, 2005

(51) Int. Cl.$^7$ .............................................. G11C 11/22
(52) U.S. Cl. ...................... 365/158; 365/145; 365/173
(58) Field of Search ................................ 365/158, 145, 365/171, 173

(56) References Cited

U.S. PATENT DOCUMENTS

| | | | |
|---|---|---|---|
| 6,128,239 A | 10/2000 | Perner | |
| 6,188,615 B1 | 2/2001 | Perner et al. | |
| 6,259,644 B1 | 7/2001 | Tran et al. | |
| 6,707,699 B1 * | 3/2004 | Jacob et al. | 365/145 |
| 2004/0004856 A1 * | 1/2004 | Sakimura et al. | 365/158 |

* cited by examiner

*Primary Examiner*—Tan T. Nguyen (57) ABSTRACT

Methods and apparatuses are disclosed for reducing the read time of a memory array. In one embodiment, the method includes sampling unknown data values from a plurality of memory elements, buffering the unknown values, writing known values to the plurality of memory elements and sampling the known values, and comparing the known values to the buffered values.

26 Claims, 9 Drawing Sheets

| SAMPLE # | 1 | 2 | 3 | 4 |
|---|---|---|---|---|
| DIGITAL COUNT FOR SAMPLE | 130 | 130 | -130 | -100 |
| DIGITAL STATE OF MEMORY ELEMENT | X | X | 1 FORCE HIGH | 0 FORCE LOW |
| NET COUNT VALUE | 130 | 260 | 130 | +30 |

FIGURE 11A

| SAMPLE # | 1 | 2 | 3 | 4 |
|---|---|---|---|---|
| DIGITAL COUNT FOR SAMPLE | 100 | 100 | -130 | -100 |
| DIGITAL STATE OF MEMORY ELEMENT | X | X | 1 FORCE HIGH | 0 FORCE LOW |
| NET COUNT VALUE | 100 | 200 | 70 | -30 |

METHOD AND SYSTEM READING MAGNETIC MEMORY

BACKGROUND

Computers have become an integral part of society. Computers may include microprocessors, storage media (e.g., CD-ROM, hard drive, floppy drive), memory, and input/output devices. Software programs running on the computer may coordinate the operation of the microprocessor. While running the programs, the microprocessor may need to write and read information to and from memory.

Memory devices are ubiquitous in numerous fields involving computers and electronics. Traditionally, memory has been implemented with storage elements capable of storing electrical charge. More recently, memory has been implemented with storage elements capable storing magnetic orientation. In general, solid-state magnetic memory arrays include individual storage elements constructed utilizing semiconductor processing techniques. Magnetic memory arrays may have advantages over non-magnetic memory arrays (e.g., DRAM) because, among other things, they do not need to be refreshed.

The individual magnetic elements of the magnetic memory array may include materials with varying magnetic properties separated by an insulating layer. The magnetic fields of the separated materials may be oriented in the same direction (termed "parallel"), or their orientation may be opposite each other (termed "anti-parallel"). The electrical resistance of the magnetic elements may vary depending on the parallel or anti-parallel orientation of the magnetic fields. In this manner, digital information may be stored and retrieved by associating digital values (e.g., 1s and 0s) to the electrical resistance associated with the parallel and anti-parallel states.

To determine the resistance value of a memory element, which effectively determines the digital value contained therein, control circuitry may be used to develop a voltage across the memory element. The control circuitry may use this voltage, or alternately a current derived from this voltage, to estimate the resistance value of the memory element. The digital value stored in the memory element may be determined from the measured resistance value.

Memory elements are often integrated on the same chip as the control circuitry. The cost of manufacturing the chip is directly related to the total chip area (i.e., the area of the array of memory elements and the area of the control circuitry), and in general, larger chips are more costly to manufacture. Because memory is often employed in consumer electronics, low cost memory is desirable. Consequently, in manufacturing low cost memory, the control circuitry is often designed to be as small possible to minimize the area and cost of the chip.

Because consumers dislike waiting while computers and other electronic devices load and unload information, the speed of memory is also important. The speed of memory depends on many factors including how much time it takes to access memory elements, and how much time it takes to read the digital value contained in the memory elements. In order to decrease the access time and decrease the read time of memory, the size and complexity of the control circuitry may need to be increased. However, as mentioned above, this may have a negative impact on the area/cost of the memory. Thus, it may be difficult to design memory that is both fast and cheap because techniques for increasing speed often lead to cost increases and vice versa.

BRIEF SUMMARY

Methods and apparatuses are disclosed for reducing the read time of a memory array. In one embodiment, the method includes sampling unknown data values from a plurality of memory elements, buffering the unknown values, writing known values to the plurality of memory elements and sampling the known values, and comparing the known values to the buffered values.

BRIEF DESCRIPTION OF THE DRAWINGS

For a detailed description of the various embodiments of the invention, reference will now be made to the accompanying drawings in which.

NOTATION AND NOMENCLATURE

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct electrical connection. Thus, if a first device couples to, a second device, that connection may be through a direct electrical connection, or through an indirect electrical connection via other devices and connections. However, the phrase "magnetically coupled" is also intended to refer to the situation in which a magnetic field emanating from a first material is induced in second material. For example, a conductor carrying a current may emanate a magnetic field that may be coupled into a magnetic material.

DETAILED DESCRIPTION

The drawings and following discussion are directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Figure 1A:
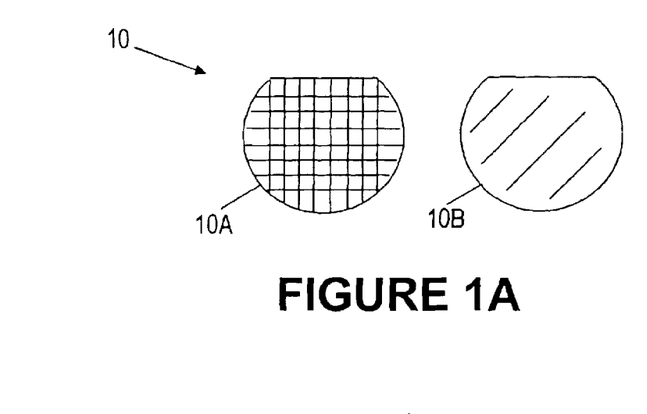
FIG. 1A shows a substrate in wafer form.
Figure 1B:
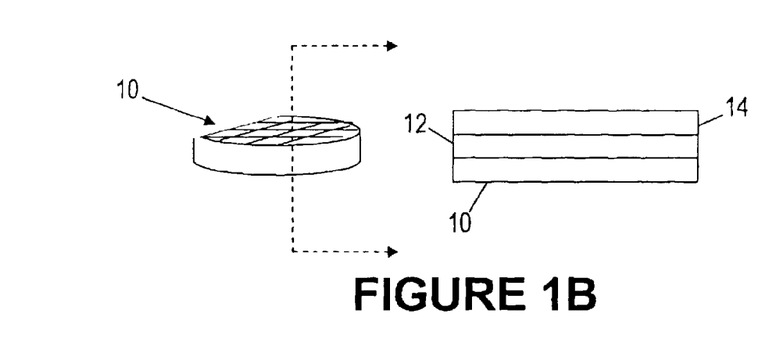
FIG. 1B shows a simplified cross-section of an integrated circuit containing magnetic memory.

FIG. 1A, depicts a substrate 10 in wafer form. Substrate 10 may comprise silicon, germanium, gallium arsenide, or other elements that have semiconducting properties. In general, circuitry and memory elements may be integrated on side 10A of the substrate while opposite side 10B may remain substantially void. FIG. 1B shows a simplified cross section of substrate 10 including circuitry 12 and memory elements 14 integrated on it. Circuitry 12 may include complementary metal oxide semiconductor ("CMOS") type transistors that may be processed according to various semiconductor processing techniques. Although circuitry 12 is discussed with respect to CMOS, other technologies (i.e., bipolar, JFET) may alternatively be used. Circuitry 12 may implement circuitry for writing and reading digital information to and from magnetic memory 14. Because different material and techniques are often used, circuitry 12 and memory 14 are often manufactured separately. For example in FIG. 1B, the transistors in circuitry 12 may be integrated on the integrated circuit prior to integrating the memory elements of memory 14.

Figure 2A:
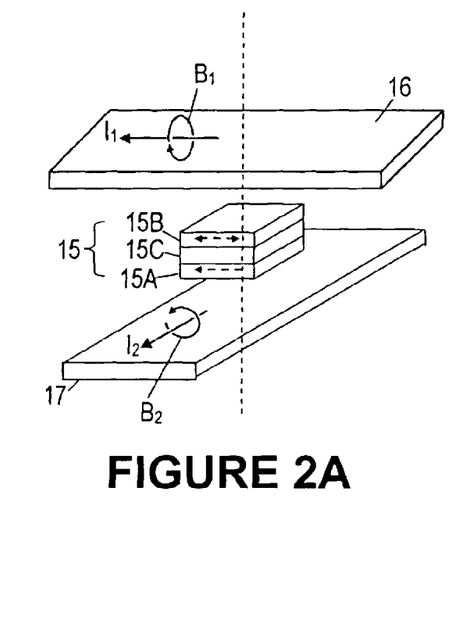
FIG. 2A shows an exemplary implementation of a magnetic memory element.

Magnetic memory 14 may include memory elements, where information may be stored in the memory elements by altering their magnetic state. FIG. 2A shows an exemplary implementation of a memory element 15. Memory element 15 may include a layer 15A that has a magnetic field with fixed direction as shown by the single sided arrow. Memory element 15 may also include another layer 15B, integrated on top of layer 15A, with an insulating layer 15C disposed between them. In this manner, layers 15A and 15B form a sandwich-like structure around layer 15C. As shown, the direction of the magnetic field of layer 15B may be adjusted to be parallel to the magnetic field of layer 15A (i.e., arrows in the same direction), or anti-parallel to the magnetic field of layer 15A (i.e., arrows in opposite directions). By varying the relative magnetic orientations (parallel or anti-parallel) of layers 15A and 15B, the electrical resistance of layer 15C may be varied.

In order to store data to memory element 15, orthogonal write lines 16 and 17 may be employed, where their crossing-point—as indicated by the dashed line in FIG. 2A—may be aligned with memory element 15. The separation distance shown in FIG. 2A between the write lines 16 and 17 and the memory element 15 is exaggerated for clarity, and the actual separation distance may be on the order of a few hundred angstroms or less. In addition alternative conductor configurations (e.g., two conductor) may include lines 16 and 17 in direct physical contact with memory element 15 with no dielectric separating the memory element 15 from either line 16 or 17. Circuitry 12 (not shown in FIG. 2A), may be electrically coupled to write lines 16 and 17 to provide electrical currents $I_1$ and $I_2$.

Current $I_1$ in write line 16 may generate a magnetic field $B_1$, and likewise current $I_2$ in write line 17 may generate a magnetic field $B_2$. Magnetic fields $B_1$ and $B_2$ may then collectively contribute to the magnetic field induced in memory element 15, where the magnetic fields $B_1$ and $B_2$ may be adjusted by adjusting the strength and direction of currents $I_1$ and $I_2$. For example, reversing the direction of the currents $I_1$ and $I_2$ will reverse the direction of the magnetic fields $B_1$ and $B_2$. Accordingly, the direction of the magnetic fields in layers 15A and 15B may be adjusted to be parallel or anti-parallel.

Figure 2B:
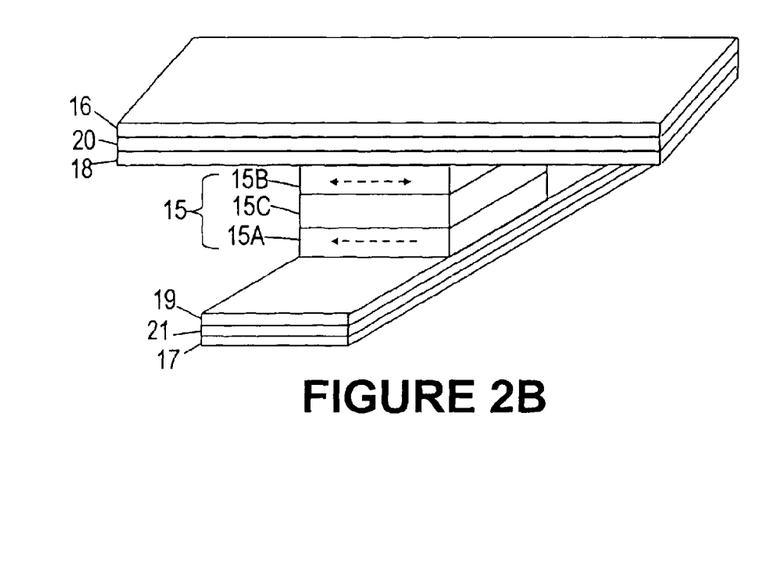
FIG. 2B shows an exemplary implementation of a magnetic memory element including read lines.

In order to read data from a memory element, orthogonal read lines 18 and 19 may be electrically coupled to the memory element as shown in FIG. 2B. An inter-layer dielectric ("ILD") 20 may electrically isolate write line 16 from read line 18. Likewise, ILD 21 may electrically isolate write line 17 from read line 19. Although read line 18 and write line 16 are shown running in the same direction, this configuration is not required, and read line 18 and write line 16 may be oriented in any direction with respect to each other. Similarly, read line 19 and write line 17 may also be oriented in any direction with respect to each other. Circuitry 12 (not shown in FIG. 2B) may be electrically coupled to read lines 18 and 19 in order to facilitate reading of memory element 15.

As shown in FIG. 2B, memory element 15 may have four conductors (i.e., write lines 16 and 17 and read lines 18 and 19), for implementing read and write operations. Although not shown in FIG. 2B, read sub-circuitry within circuitry 12 may be coupled to read lines 18 and 19, where the read sub-circuitry may provide a voltage between the read lines. Also, write sub-circuitry within circuitry 12 may be coupled to write lines 16 and 17, where the write sub-circuitry may provide currents in the write lines. Hence, the configuration shown in FIG. 2B is often referred to as a "four-conductor" configuration. Note, however, that other configurations are possible, for example, write line 16 and read line 18 may be combined to form a "three-conductor" arrangement, or write line 16 and read line 18 may be combined and line 17 and read line 19 may be combined to form a "two-conductor" arrangement.

Since the magnetic fields of 15A and 15B are capable of being adjusted to be either parallel or anti-parallel, the resistance measured between read lines 18 and 19 may be changed as the direction of the magnetic fields are changed. For example, if the magnetic fields of 15A and 15B are parallel the resistance between lines 18 and 19 may be 1 MΩ and associated with a digital 1, whereas if the magnetic fields of 15A and 15B are anti-parallel the resistance may be 1.1 MΩ and associated with a digital 0. Because the resistance of the memory element 15 may indicate the digital state, memory elements often are indicated using resistive elements.

Figure 3:
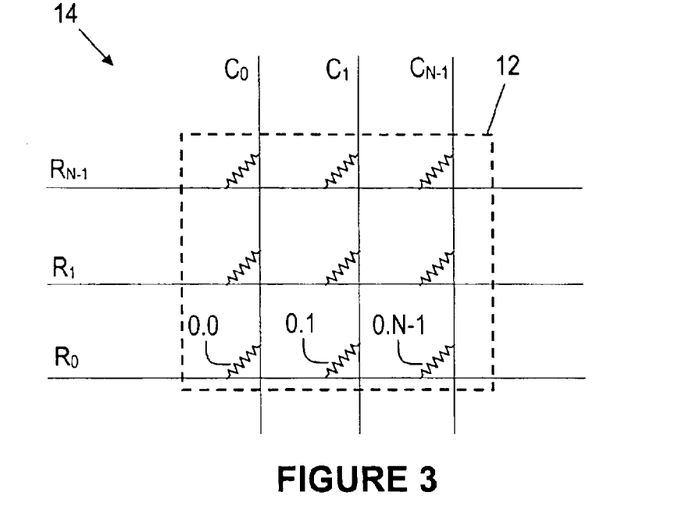
FIG. 3 shows a schematic representation of a magnetic memory array.

FIG. 3 shows a schematic representation of the integrated circuit cross-section of FIG. 1B. Referring to FIG. 3, circuitry 12 is shown as a dashed box existing beneath an array of magnetic memory elements 14. Memory elements 14 may be arranged in an array of columns $C_0$–$C_{N-1}$ and rows $R_0$–$R_{N-1}$. Individual memory elements may be depicted using resistive elements, and may be designated by noting their crossing rows and columns. For example, memory element "0.0" would represent the memory element that is located at the intersection of row $R_0$ and column $C_0$. The magnetic memory elements may be modeled using various devices such as capacitors, resistors, inductors, tunnel junctions in series with diodes, or other combinations of integrated circuit elements. Circuitry 12 may be electrically coupled to memory 14, and may facilitate reading data from memory 14. In some embodiments, circuitry 12 occupies less space than the memory 14. In this manner, the overall size of the integrated circuit shown in FIG. 1B may be determined by the size of the memory 14, rather than the size of controlling circuitry 12.

Figure 4:
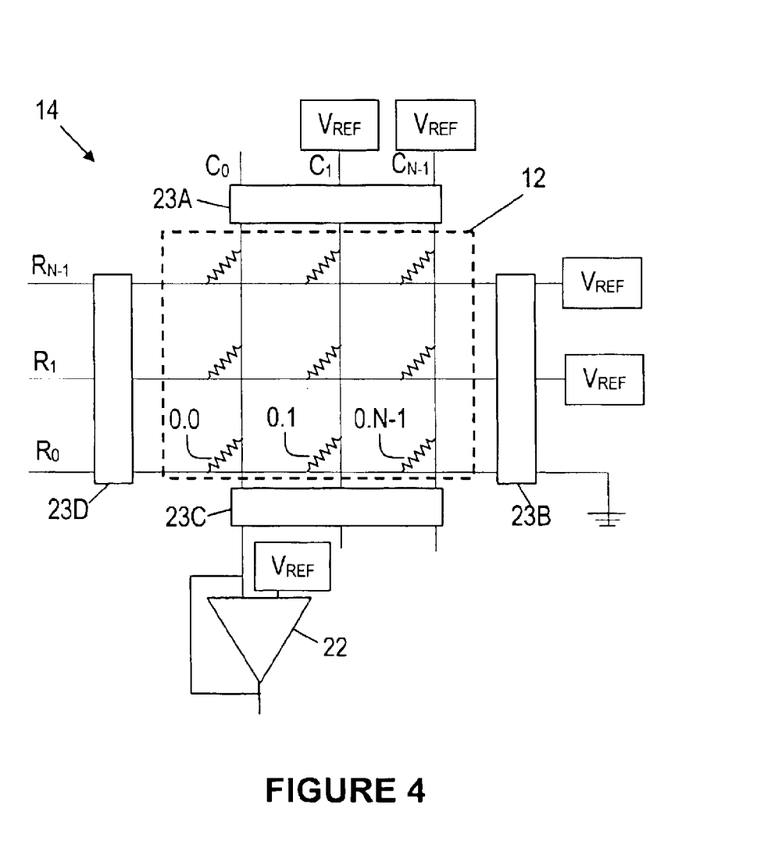
FIG. 4 illustrates operation of one embodiment for reading elements of a memory.

FIG. 4 shows an exemplary embodiment for reading elements of memory 14. In order to determine the digital value associated with memory element 0.0, a sense element 22 may be coupled to column $C_0$. Determining the digital value of memory element 0.0 may entail selecting memory element 0.0, while deselecting the remaining memory elements. Accordingly, row $R_0$ may be coupled to ground, rows $R_1$–$R_{N-1}$ may be coupled to a predetermined voltage $V_{REF}$, and columns $C_1$–$C_{N-1}$ may also be coupled to $V_{REF}$. The predetermined voltage $V_{REF}$, may be coupled to sense element 22 so that $V_{REF}$ may be regulated across memory element 0.0. With a known voltage ($V_{REF}$) across memory element 0.0, the resistive value (i.e., digital state), associated with memory element 0.0 may be determined from the sense element current. Multiplexers 23A–D may be employed to assist in coupling the proper voltages to the desired columns and rows to facilitate selecting the desired memory element.

In order to determine the digital value of subsequent memory elements in row $R_0$, the sense element 22 may be coupled to the next column, while the previous column is coupled to $V_{REF}$. For example, if memory element 0.1 is to be read, the same voltages may be assigned to the same rows and columns as was the case for element 0.0, except now, the sense element 22 may be coupled to column $C_1$ and $V_{REF}$ may be coupled to column $C_0$.

The process of applying a predetermined voltage $V_{REF}$ to each memory element and measuring the current in the memory element may need to be repeated several times for each memory element (e.g., various self-referencing techniques described below). This process may repeat since the resistance characteristics of different memory elements may not be the same and may need to be individually determined for each memory element.

One reason for resistive variation between memory elements may be that the insulating layer 15C, as shown in FIGS. 2A and 2B, may not be uniformly deposited across the chip. Thus, one memory element may have an insulating layer 15C with a different thickness than another. This variation may result in the different memory elements having different resistive values for the same digital state. For example, memory element 0.0 may provide a resistive value of 1 MΩ to indicate a digital 0, and a resistance of 1.1 MΩ to indicate a digital 1. Illustratively, memory element 0.1 may provide a resistive value of 1.5 MΩ to indicate a digital 1, and a resistance of 1.6 MΩ to indicate a digital 0. Therefore, an individual determination of the resistance associated with the different digital states may need to be performed-e.g., self-referencing.

One method for self-referencing may involve measuring the resistance of an unknown digital value from a memory element, writing a known digital state to the memory element, and then comparing the resistance associated with the unknown digital value to the resistance associated with the known digital value. If the resistance associated with the known digital value is close to the resistance associated with the unknown digital value, then the unknown value is probably equal to the known digital value that was written to the memory element.

For example, suppose that memory element 0.0 of FIG. 4 contains an unknown data value, and sense element 22 indicates a resistance of 1.2 MΩ. Because each memory element in the array may have may have different resistive values for digital 1 and digital 0, a measured resistance of 1.2 MΩ may indicate either a digital 1 or a digital 0. Known digital states may then be written to memory element 0.0, for example, suppose that a digital 1 is written to memory element 0.0, and sense element 22 now indicates a resistance of 1.5 MΩ. Also, suppose that digital 0 is written and sense element 22 indicates a resistance of 1.0 MΩ. Because the resistance associated with the original unknown digital value (1.2 MΩ), is closer to the resistance associated with digital 0 than the resistance associated with digital 1, the original unknown digital value was probably a digital 0.

Figure 5:
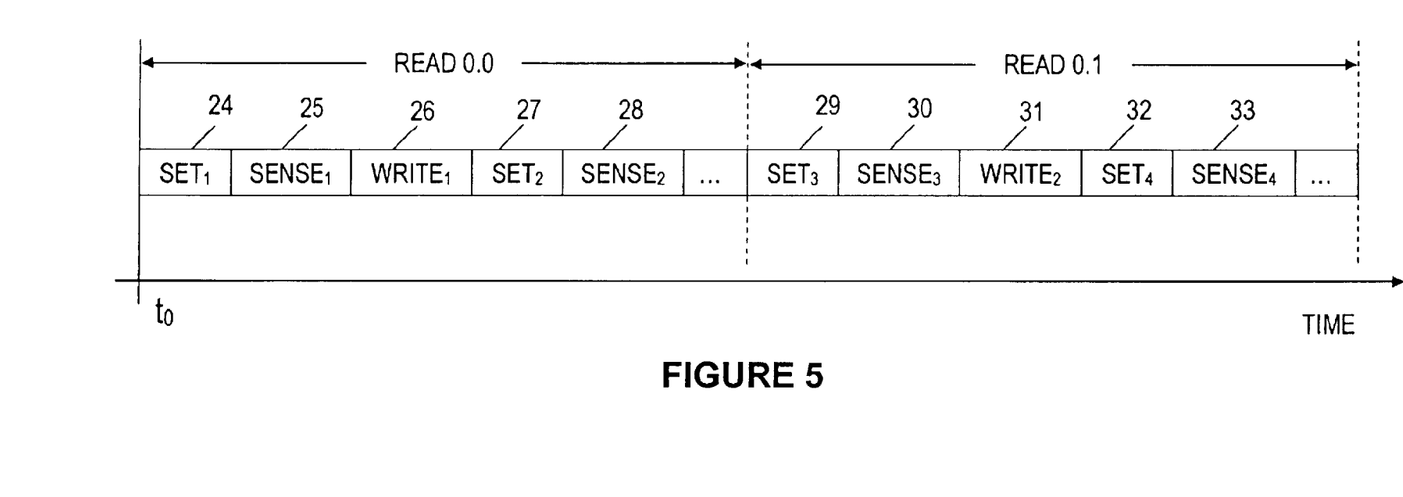
FIG. 5 illustrates the timing associated with a sequential self-referencing technique.

FIG. 5 illustrates the timing associated with a sequential self-referencing technique that may be used in conjunction with the arrangement of FIG. 4. The timing arrangement of FIG. 5 involves processing the information in one memory element (e.g., memory element 0.0) prior to attempting to determine the state of subsequent memory element (e.g., memory element 0.1). Sense element 22 may be configured to read memory element 0.0 at time $t_0$. Prior to time $t_0$, memory element 0.0 may have been being written to, and therefore element 0.0 may contain an unknown data value. The magnitude of the voltages used for writing data to memory element 0.0 may be different than the voltages used for reading data from memory element 0.0. Accordingly, sense element 22 may have to wait for the array to settle out in preparation of being read, as indicated by time period 24, where the settle time associated with time period 24 may be approximately 2 $\mu$S.

Time period 25 illustrates the time associated with sensing the unknown data value contained in memory element 0.0, where this sense time associated with time period 25 may be in the order of 1–10 $\mu$S. Self-referencing may involve writing known values to memory element 0.0, and so time period 26 may represent the amount of time that it takes to write the known value. The time associated with writing a value to a memory element may be approximately 0.5 $\mu$S or less. Similar to time period 24, sense element 22 may need to wait for the array to settle out prior to reading the known value from memory, as indicated by time period 27. Akin to time period 24, the settle time associated with time period 27 may be approximately 2 $\mu$S. Time period 28 illustrates the time associated with sensing the known data value that was written during time period 26.

Time periods 26, 27, and 28 represent a single self-referencing sample. In order to increase the accuracy of memory element 0.0, multiple samples may be necessary. Thus, for each self-referencing sample, time periods 26, 27, and 28 may repeat. Once the value of memory element 0.0 has been determined using multiple samples, subsequent memory elements, such as memory element 0.1 may be read as shown in FIG. 5. Reading subsequent memory elements may involve analogous time periods associated with multiple self-reference samples as indicated by time periods 29–33.

Self-referencing techniques that process information from one memory element prior to attempting to determine the state of subsequent memory element may prove adequate for small arrays-i.e., where the overall number of subsequent memory elements to be read is small. However, in larger memory arrays, the amount of time that sense element 22 spends trying to read the correct value for each memory element may add up. Performing multiple self-referencing samples, in order to increase the accuracy of the read, may also lengthen the amount of time required to read the value of a memory element.

Figure 6:
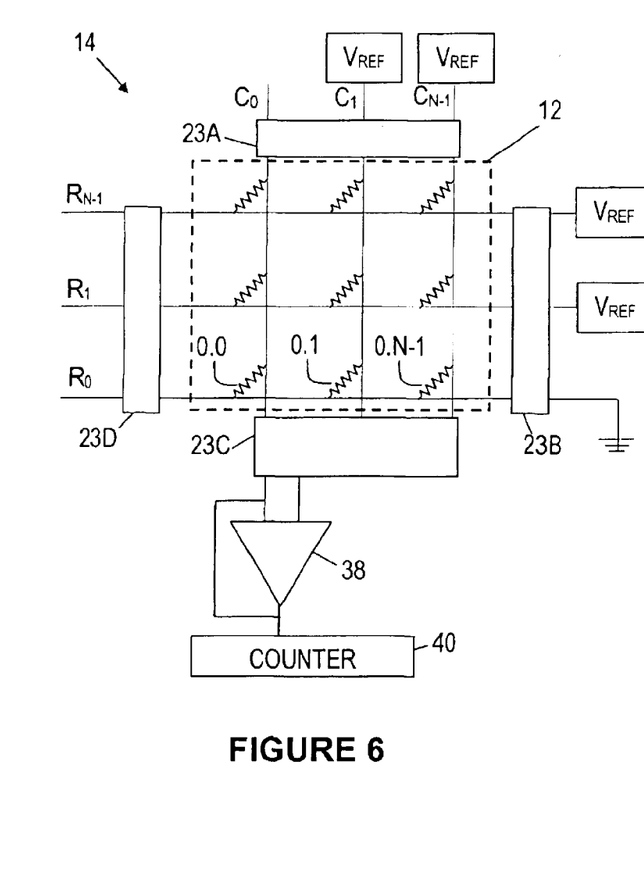
FIG. 6 illustrates operation of an alternative embodiment for reading memory elements.
Figure 7:
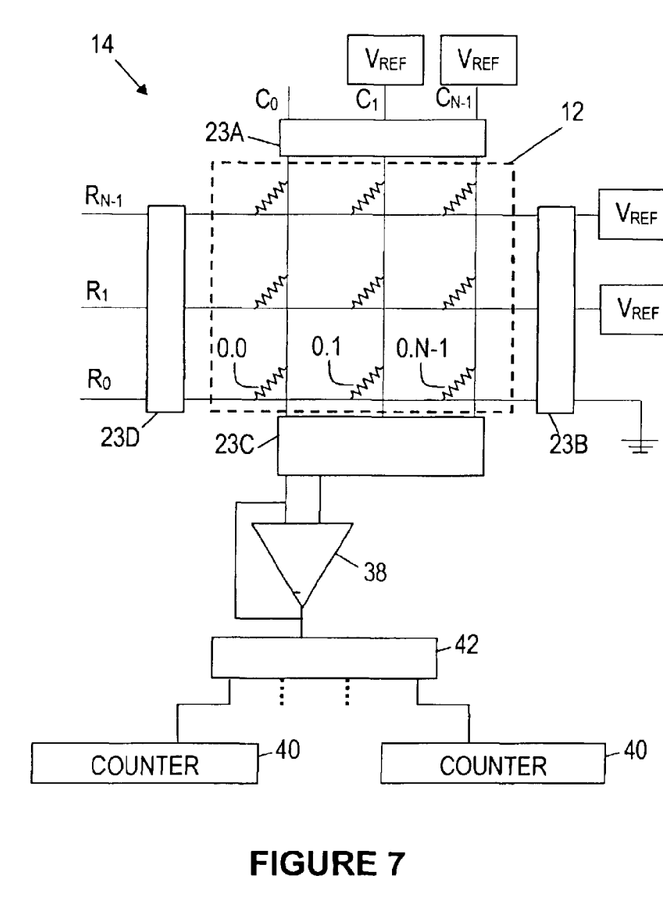
FIG. 7 illustrates operation of yet another embodiment for reading memory elements.

In accordance with embodiments of the present invention, techniques for reducing the overall read time of a memory array while minimizing increases in the overall chip area are disclosed. FIG. 6 shows one embodiment for reducing the overall read time of memory 14. Multiplexer 23C may dynamically couple sense element 381 to each individual memory element for reading. Multiplexer 23C may be either an analog or a digital multiplexer depending on the type of signal that it couples. In reading each memory element, sense element 38 may provide a resistance measurement. Sense element 38 may be configured, along with a digital counter 40, to translate the resistance measurement into a digital count value. A plurality of digital counters as shown in FIG. 7 may be used where multiplexer 23C may facilitate coupling sense element 38 to the plurality of counters. In this manner, there may be a counter associated with each column $C_0$–$C_{N-1}$. Multiplexer 23C may be either an analog or a digital multiplexer depending on the type of signal that it couples.

Figure 8:
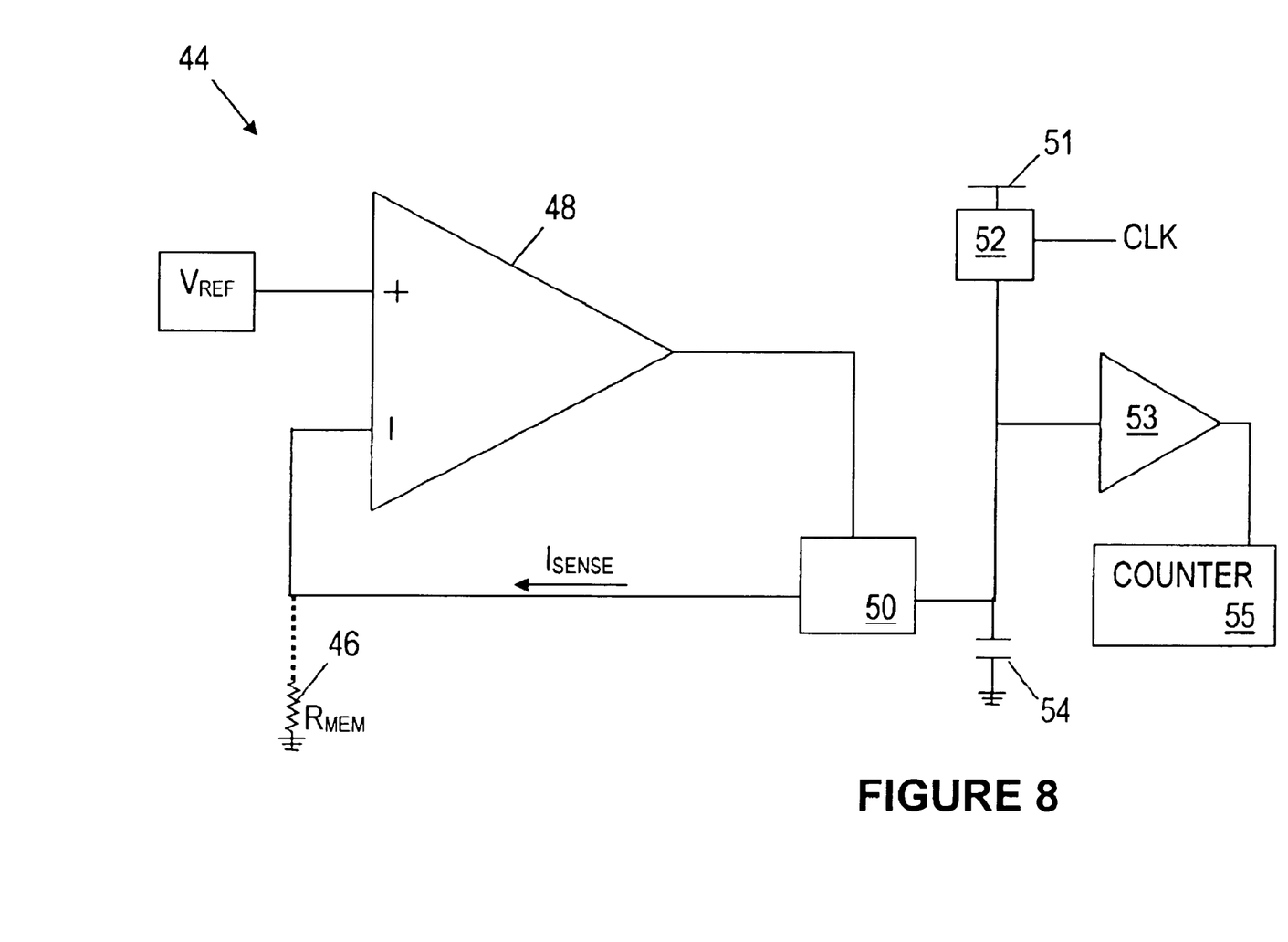
FIG. 8 shows an exemplary circuit for translating a resistive value into a digital count.

FIG. 8 shows an exemplary circuit 44 for translating the resistance associated with memory element 46 into a digital count, where memory element 46 may be any memory element in FIG. 6 (e.g., 0.0, 0.1) and may be represented by a resistor $R_{MEM}$. The arrangement shown in FIG. 8 represents one of many possible ways of translating the resistive value of a memory element into a digital count.

Referring to FIG. 8, the predetermined reference voltage $V_{REF}$, may be coupled to the positive input of amplifier 48. The negative input of amplifier 48 may be coupled to one terminal of the memory element 46, while the other terminal of memory element 46 may be coupled to ground. A switch 50 may also be coupled to the negative input terminal of the amplifier 48. Switch 50 may be a transistor or equivalent switching device. The output of the amplifier 48 may be coupled to the control terminal of switch 50, so as to provide a negative feedback loop for amplifier 48 and regulate $V_{REF}$ across memory element 46.

The current in memory element 46, $I_{sense}$, may be provided by a voltage source 51 through a switch 52. The control terminal of switch 52 may be connected to a clock signal CLK from a digital controller (not shown in FIG. 8). When CLK is asserted, switch 52 may be in a conducting state to supply $I_{sense}$ to $R_{MEM}$ and pre-charge integration capacitor 54 to the source voltage 51. When CLK is de-asserted the switch 52 may go to a non-conducting state and $I_{sense}$ may be supplied from the integration capacitor 54. During the integration period, the voltage across capacitor 54 may decrease from an initial value $V_{init}$ to a second value $V_{final}$. In this manner, capacitor 54 may be charged to an initial value $V_{init}$, using voltage source 51, and may be disconnected from voltage source 51 when the signal CLK is de-asserted. A comparator 53 and a counter 55 may be included in order to measure the discharge time of capacitor 54, and the counter may be coupled to comparator 53 and the capacitor 54 may be coupled to the comparator 53.

Once capacitor 54 is charged to $V_{init}$ and switch 52 disconnects voltage source 51 from capacitor 54, the capacitor 54 may still be coupled, through switch 50, to memory element 46. As mentioned above, memory element 46 may be regulated at a voltage of $V_{REF}$, but because switch 52 may disconnect voltage source 51 from capacitor 54, the current $I_{sense}$ is now provided by capacitor 54. Since capacitor 54 may now provide $I_{sense}$, the discharge time of capacitor 54 may be measured with counter 55. For example, the amount of time that it takes for capacitor 54 to discharge from an initial voltage $V_{init}$ to a final voltage $V_{final}$ may be measured by the counter 55, where comparator 53 may provide a signal to counter 55 indicating when the initial voltage $V_{init}$ and final voltage $V_{final}$ are attained. The initial voltage $V_{init}$ may be equal to any voltage including the voltage of the voltage source 51. Likewise, the final voltage $V_{final}$ also may be equal to any voltage including the reference voltage $V_{REF}$ that is regulated across the memory element 46. Equation (1) illustrates the discharge time that may be measured by the counter 55, and represented as a digital count, when capacitor 54 has a capacitance C, and an initial voltage value $V_{init}$ and a final value of $V_{final}$.

$$T_{dis} = \frac{C(V_{init} - V_{final})}{I_{sense}} \qquad \text{Eq. (1)}$$

Because the value of $V_{REF}$ may be known, the resistance $R_{MEM}$ of the memory element 46 may be directly proportional to the current $I_{sense}$ flowing through it. Thus, by measuring the discharge time on capacitor 54 from $V_{init}$ to $V_{final}$, as indicated in Equation (1), the amount of current $I_{sense}$ may be determined, so that the resistance $R_{MEM}$ of memory element 46 may be determined. By associating the resistive value of a memory element to a digital count, self-referencing techniques may be employed.

Figure 9:
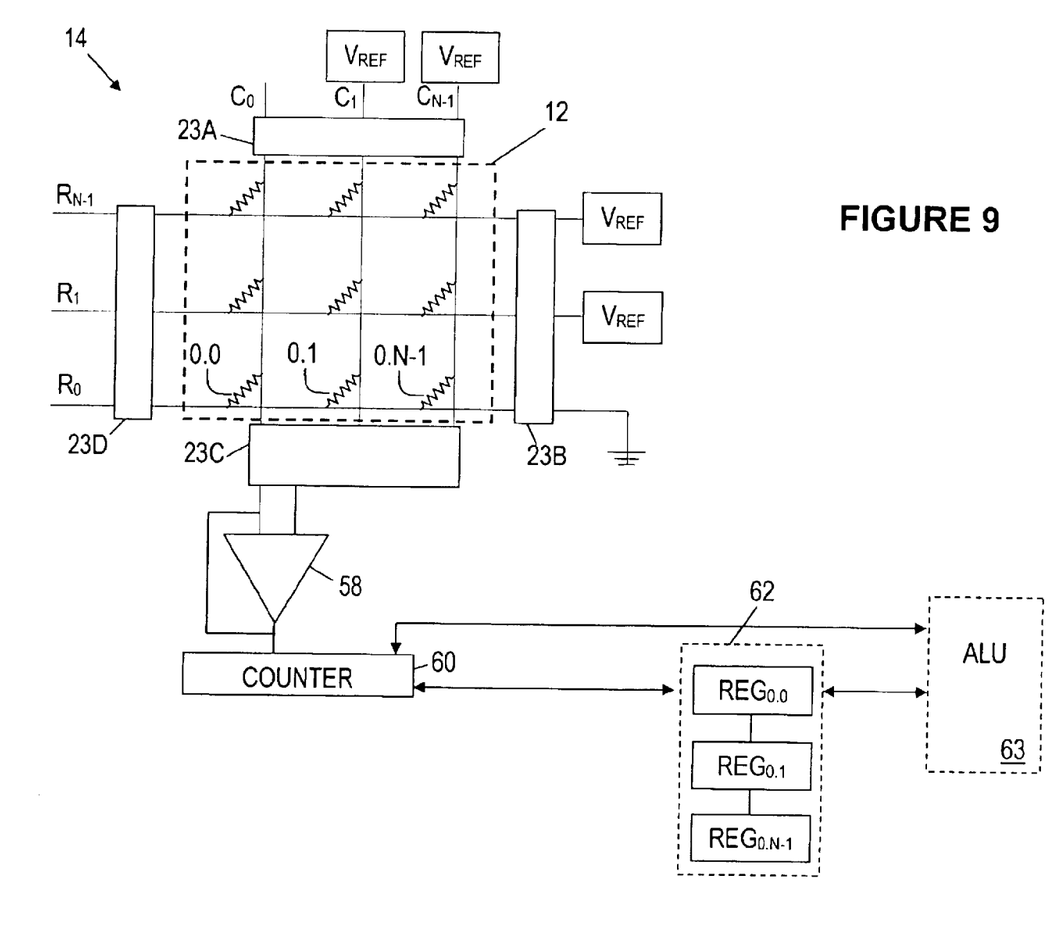
FIG. 9 illustrates operation of still yet another embodiment for reading memory elements.

FIG. 9 shows another embodiment for reducing the overall read time of memory 14. Multiplexer 23C may dynamically couple sense element 58 to each individual memory element for reading. In reading each memory element, sense element 58 may provide a resistive measurement. Sense element 58 may be configured, along with a digital counter 60, to translate the resistive measurement into a digital count value. Counter 60, which may include more than one counter, may be coupled to a plurality of registers so that the digital count value associated with a memory element may be stored into one of the plurality of registers 62 ($REG_0$–$REG_{N-1}$). There may be a register $REG_0$–$REG_{N-1}$, associated with each column $C_0$–$C_{N-1}$ of memory 14. Alternatively, each register may be assigned to multiple memory elements. For example, there may be 16 memory elements in a row and there may be four registers shared among the 16 memory elements. The registers 62 may include traditional solid-state memory such as synchronous dynamic random access memory ("SDRAM"). An optional arithmetic logic unit ("ALU") 63 may also be coupled to the plurality of registers 62. Count values generated by counter 60 may be stored in registers 62, and may reduce the overall read time of memory 14.

Figure 10:
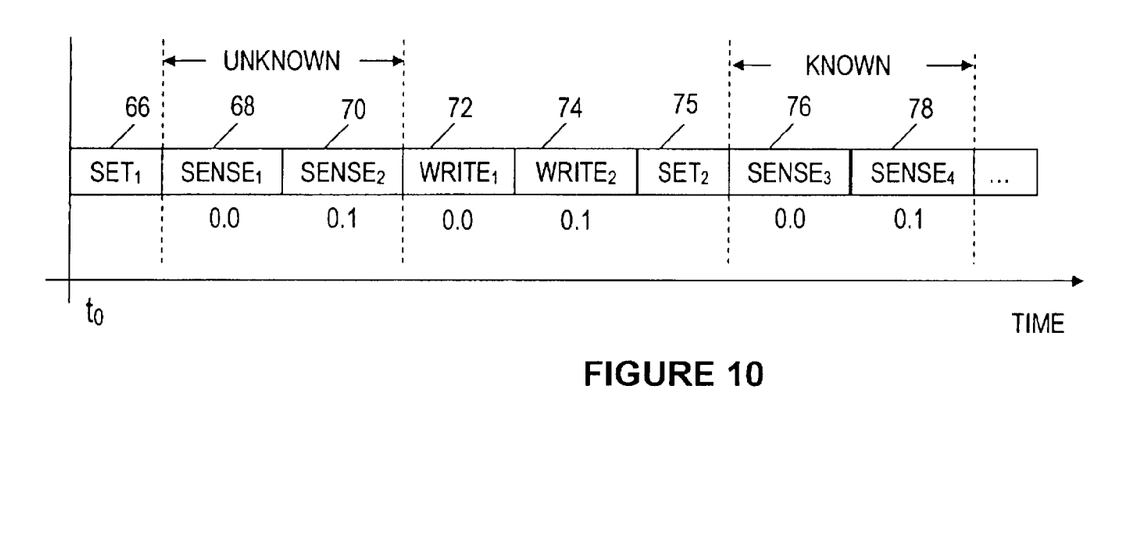
FIG. 10 illustrates the timing associated with a contemporaneous self-referenced read operation.

FIG. 10 illustrates the timing associated with a contemporaneous self-referencing read operation of the circuit arrangement shown in FIG. 9. The timing arrangement of FIG. 10 involves processing the information in one memory element (e.g., memory element 0.0) at the same time as processing the information from a subsequent memory element (e.g., memory element 0.1). Referring now to the timing illustrated in FIG. 10, the sense element 58 may be configured to read memory elements sequentially and store the stored value in registers 62. Sense element 58 may wait for the array to settle out from previous write operations before being read, as indicated by time period 66. The settle time associated with time period 66 may be similar to the settle time associated with time period 24 from FIG. 5, and may be approximately 2 μS. Memory element 0.0 may be sensed in time period 68, where the contents of memory element 0.0 are unknown, and this sense time may be in the order of 1–10 μS, as was the case with time period 25 in FIG. 5.

The value of memory element 0.0 may be translated into a digital count by counter 60 and stored in corresponding register within registers 62. Instead of writing a known value into memory element 0.0 after reading its unknown value, as was the case in FIG. 5, a subsequent read may be performed. Sense element 58 may be coupled to a subsequent memory element (e.g., memory element 0.1), and the value of the subsequent memory element may be translated and stored in a corresponding register within the plurality of registers 62, as indicated by time period 70. Subsequent memory elements may also be read in this manner, and although only two memory elements (0.0 and 0.1) are shown in FIG. 10, the number of successive memory elements that may be read may depend on the number of registers available within the plurality of registers 62.

Once the unknown states for the successive memory elements have been read and stored in registers, known values may be written to memory elements 0.0 and 0.1 as shown by time periods 72 and 74. Some magnetic memory configurations allow many memory elements to be written to the same value simultaneously, so that the time periods associated with writing known values to the memory elements may be combined. For example, time periods 72 and 74 may be combined into one single write operation, requiring less time to perform than several sequential write operations. Time period 75 represents a settle time associated with the array akin to time period 66. Time period 76 may correspond to reading the known value (written during time period 72), from memory element 0.0. By comparing the known state from time period 76 to the unknown state read in time period 68, a determination may be made about the digital value of memory element 0.0. Likewise, time period 78 may involve reading the known state of memory element 0.1, so that a comparison may be made with the unknown state of time period 70.

Comparing the timing sequences of FIG. 5 and FIG. 10, the time required to determine the digital state of memory elements 0.0 and 0.1 may be substantially reduced by implementing the register arrangement shown in FIG. 9. Specifically, time period 29 and time period 32 are no longer needed because the sense operations and write operations are grouped together. Therefore time periods 24 and 29 may be combined to form one single time period 66. Likewise time periods 27 and 32 may be combined to form a single time period 75. The timing of FIG. 10 may be further reduced in memory that is capable of simultaneously writing many memory elements. Writing the same value to multiple memory elements simultaneously may then allow time periods 72 and 74 to be combined into one single write period. Furthermore, the embodiment shown in FIG. 10 may dramatically increase as the number of memory elements that are read increases.

Comparing the digital count associated with a known state to a digital count associated with an unknown state may be accomplished in a variety of ways. The two counts may be subtracted using ALU 63, so that if the difference is large then the unknown value and the known value may not be the same. Alternatively, if the difference between the digital count representing the known value and the digital count representing the unknown value is small then the known value and the unknown value may be the same. In addition, the counter 60 may be an up/down counter that is capable of counting in both directions. In this manner, the digital count associated with the unknown value may be stored in the counter 60, and prior to counting the digital value for the known value the count direction of counter 60 may be reversed so that the resulting count in counter 60 may be the difference between the known and unknown states of the memory element. Also, the digital count stored in the register may inverted (e.g., by performing 2s complement using ALU 63) and used to offset the counter 60. In this manner, the digital count in counter 60 may represent the difference between the known and unknown states of the memory element.

Figure 11A:
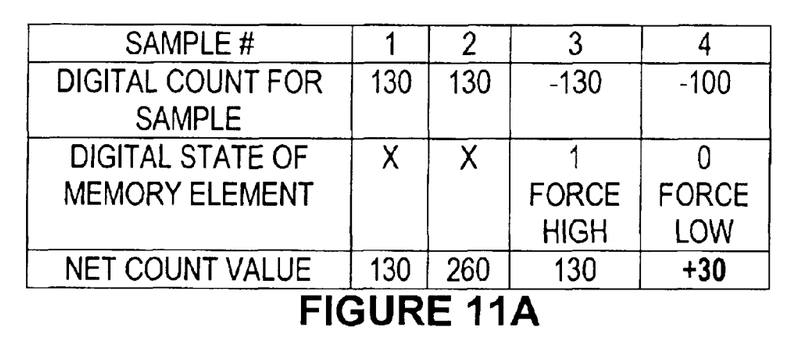
FIG. 11A illustrates an example of a self-referencing technique.
Figure 11B:
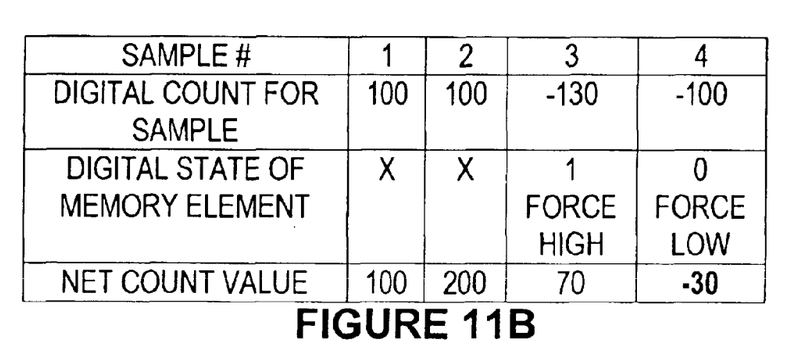
FIG. 11B illustrates operation of another example of a self-referencing technique.

FIGS. 11A and 11B illustrate examples of a quad sample self-referencing techniques that may be used in conjunction with the arrangements of FIGS. 7 and 9. Referring to FIG. 11A, a quad sample is shown for the case of memory element 0.0 containing a digital 1. Sample number 1 may be taken, where the resistance of memory element 0.0 may be translated into a digital count of 130 as described above. Because the resistances associated with high and low digital states may need to be individually determined, the digital count of 130 taken in sample number 1 may not be able to be associated with a digital value. Accordingly, the digital state of memory element 0.0 may be unknown as indicated in FIG. 11A by the letter X. Counter 60 may be an up/down counter, where the count direction of counter 60 may be reversed depending on which sample is being taken. By reversing the count direction, the net digital count value may be represented as shown in FIG. 11A. In this manner, the sum and difference of successive samples may be calculated using counter 60.

Sample number 2 may involve sampling memory element 0.0 again so that the digital count for sample number 2 may be 130, and the net count value in counter 60 may be 260. During sample number 3, a known value of digital 1 may be written to memory element 0.0, and this known digital value may correspond to a count value of 130. In sampling this known value, the direction of counter 60 may be reversed during the sample so that the digital count value of sample number 3 is −130, and the net count value in counter 60 after sample number 3 has been taken is 130. The net count value may either be retained in counter 60 or registers 62 may retain the net count value and load counter 60 with the net count value prior to each sample.

Sample number 4 may involve writing a known digital 0 value to memory element 0.0, where the digital count associated digital 0 may be −100. The net count in counter 60 after sample 4 is taken may be +30, where the sign of the count value may indicate the digital value contained in the memory element.

FIG. 11B shows the situation where digital 0 is contained in memory element 0.0 and the sign of the count value is negative. Counter 60 may include a sign bit, and this sign bit may indicate the initial unknown state of the memory element. Thus, in sample numbers 1 and 2, the counter may count up, while in sample numbers 3 and 4, the counter may count down, and the sign of the net count contained in counter 60 may represent the initial unknown state of the memory element.

During sample number 2, registers 62 may coupled to counter 60, and therefore sample number 2 may involve doubling the digital count value stored in the registers—i.e., the digital count value sampled in sample number 1. This process may reduce read time as the sample time for sample number 2 may be eliminated by doubling the value contained in the register. This doubling may be accomplished in a variety of ways including shifting bits representing the digital count to the left. Alternatively, the digital count value from sample number 1 may be written to multiple registers within the plurality of registers 62. ALU 63 may then add contents of the two registers together.

Due to possible inefficiencies of translating the digital value of a memory element to a digital count value, the translated digital count value may not be consistent. For example, in FIG. 11A, the digital count value for samples 1 and 2 may be non-equal, even though the same value is being sampled. Sampling the memory element multiple times may help to overcome any inconsistencies in reading memory sensing memory element values.

Since the self-referencing techniques disclosed may modify the initial value of each memory element, restoration of the initial value may be necessary, which may increase the overall read time. The initial value of the memory element may have been determined using self-referencing techniques. During self-referencing, the memory elements may have been written with known data values. If the known data values written during the self-referencing are the same as the initial data values, then restoration may not be necessary. Accordingly, by comparing the initial value of the memory element to a known value written during self-referencing, memory elements may be selectively restored. Selective restoration may occur by loading data from registers 62 or from counter 60.

Figure 12:
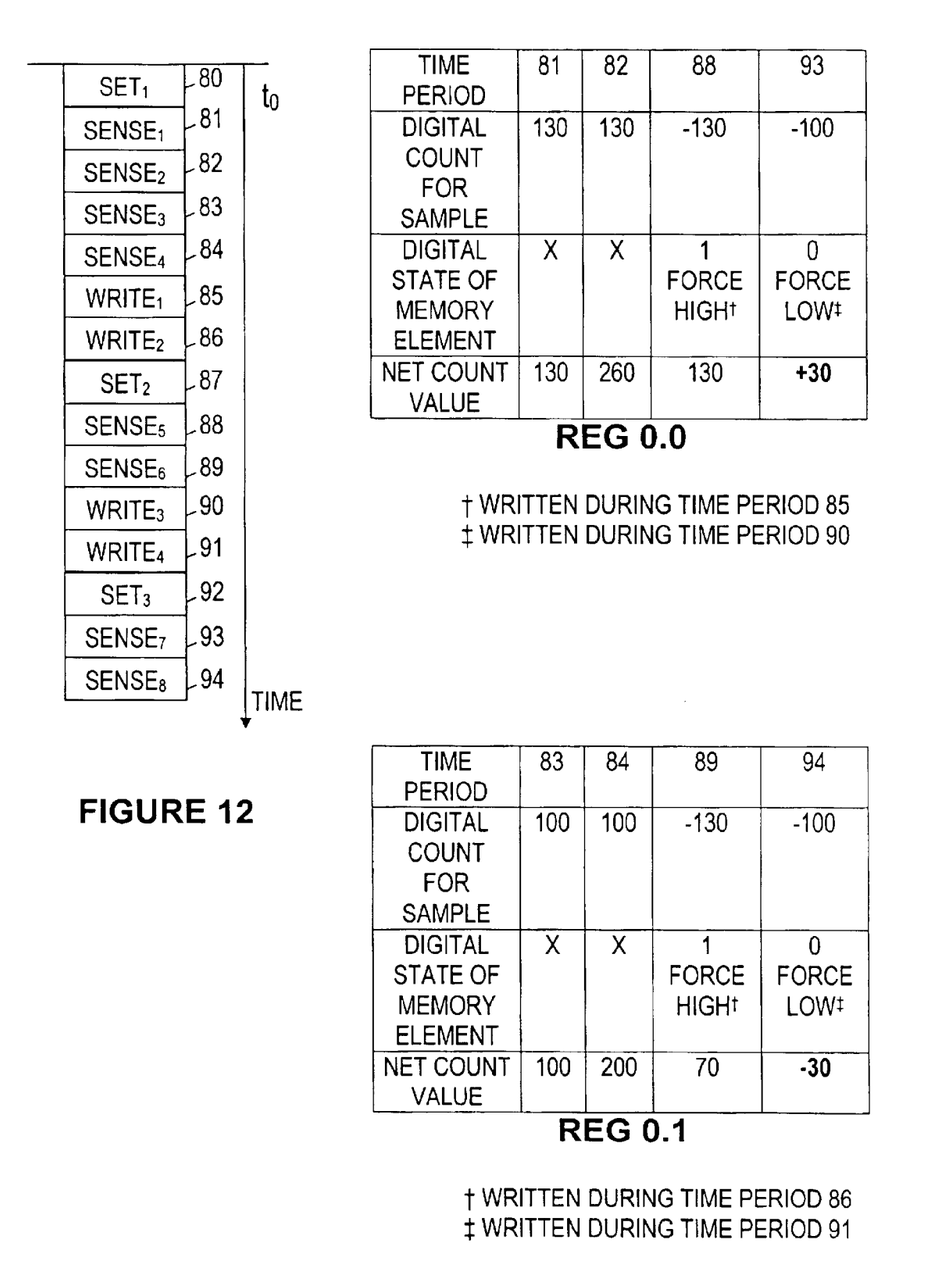
FIG. 12 shows the example from FIGS. 11A and 11B applied to the various reading embodiments.

FIG. 12 shows the exemplary multiple sample self-referencing techniques employed in conjunction with the various embodiments of the invention. FIG. 12 will be explained in regard to the embodiment of FIG. 9. Although two memory elements are shown in FIG. 12, many memory elements may be read using the disclosed techniques. The contents of registers $REG_{0.0}$ and $REG_{0.1}$ are shown in FIG. 12. Although FIG. 12 shows registers containing the net count value, an up/down counter may be used as an accumulator with the capability to increase and decrease the accumulated value.

Referring to FIG. 12, time period 80 represents the initial settling time associated with the memory array, similar to time period 66 in FIG. 10. Time period 81 represents sensing memory element 0.0 and storing the count in $REG_{0.0}$. The count for time period 81 may be 130. The digital value corresponding to the count may be undetermined (hence, the need for self-referencing) as indicated by X. Time period 82 represents sensing the memory element 0.0 again, where the count is again measured at 130. The contents of $REG_{0.0}$ may then be the net count 260. Because the sense and write operations may be grouped together, subsequent memory elements may be sensed after time period 82 instead of writing a known value to memory element 0.1 (which happens in later time period 85, as described below).

Time period 83 represents sensing memory element 0.1 and storing the count in $REG_{0.1}$. The count for time period 83 may be 100. The digital value corresponding to the count may again be undetermined as indicated by X in FIG. 12. Time period 84 represents sensing the memory element 0.1 a second time, where the count is again measured at 100. The contents of $REG_{0.1}$, may then be the net count 200. Time periods 85 and 86 represent writing a known value to the memory elements for memory elements 0.0 and 0.1 respectively. In this example, the known value written during time periods 85 and 86 is digital 1. The known value written to memory elements 0.0 and 0.1 may be sensed during the next group of sensing operations after waiting a settling time as indicated in time period 87.

Time period 88 represents sensing the known value written to memory element 0.0, which in this case was digital 1. The sensed value may then be subtracted from the net count value. This may occur by pre-loading the count value into the counter 60 from $REG_{0.0}$ and reversing the count direction of counter 60. Accordingly, the net count value in $REG_{0.0}$ after time period 88 may be 130. Similarly, time period 89 may represent sensing memory element 0.1 and the net count value after time period 89 may be 70.

Akin to time periods 85 and 86, time periods 90 and 91 represent writing a known digital value to memory elements 0.0 and 0.1 respectively. In this example, the known value written during time periods 90 and 91 is digital 0. Prior to sensing this known value, a settle time may occur, as indicated by time period 92.

Time period 93 represents sensing the known value written to memory element 0.0, which in this case was digital 0. The sensed value may then be subtracted from the net count value. This may occur by pre-loading the count value into the counter 60 from $REG_{0.0}$ and reversing the count direction of counter 60. Accordingly, the net count value in $REG_{0.0}$ after time period 93 may be +30. At this point, the sign of the count may indicate that the initial unknown state of memory element 0.0 was digital 1. Similarly, time period 94 may represent sensing memory element 0.1 and the net count value after time period 89 may be −30, where the sign of the value contained in $REG_{0.1}$ may indicate that the initial unknown state of memory element 0.1 was digital 0.

Figure 13:
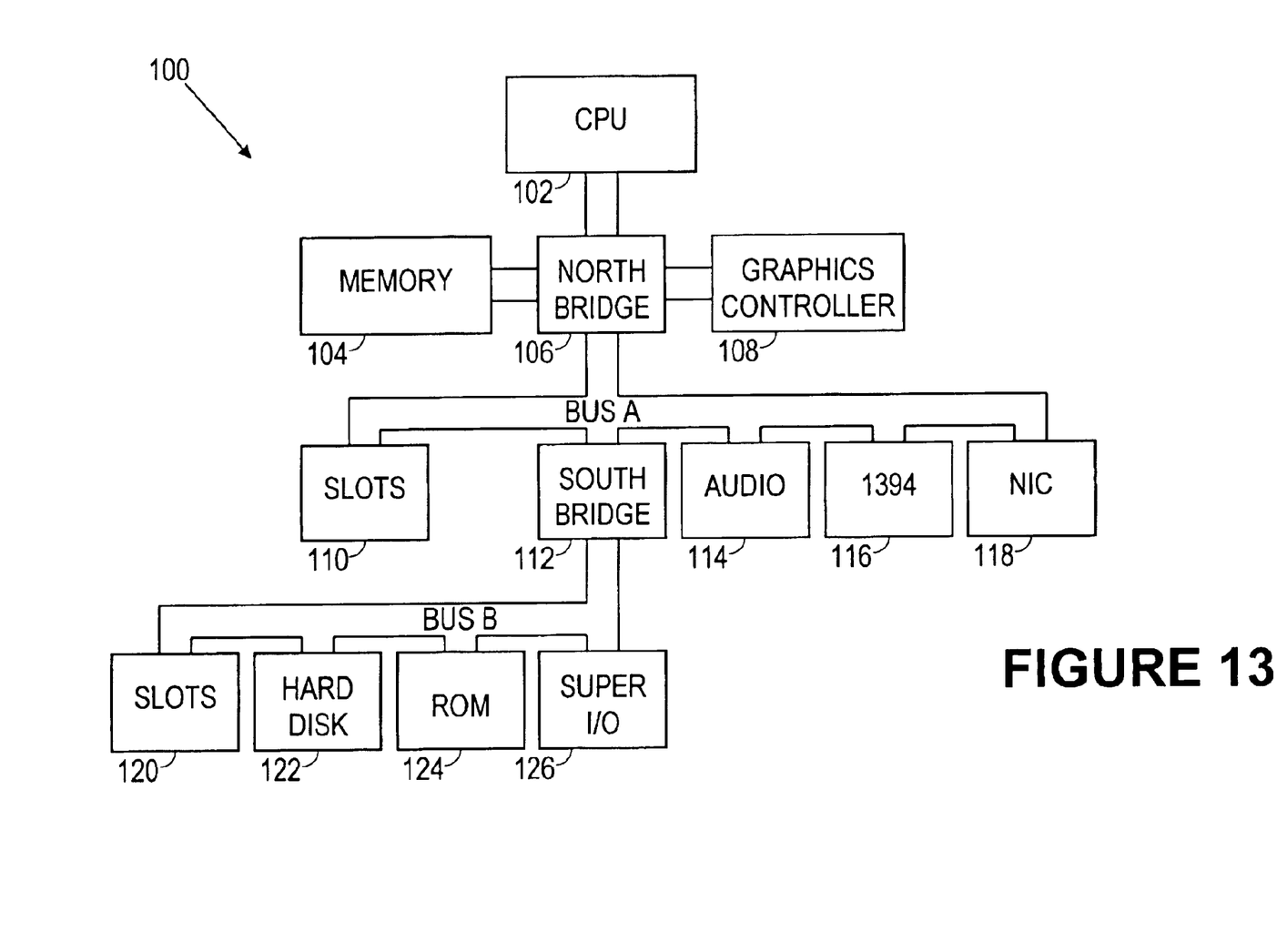
FIG. 13 shows an exemplary computer system that may utilize magnetic memory disclosed herein.

The memory disclosed herein, and the methods for reducing memory read time may be used in a computer system. FIG. 13 illustrates an exemplary computer system 100. The computer system of FIG. 13 includes a CPU 102 that may be electrically coupled to a bridge logic device 106 via a CPU bus. The bridge logic device 106 is sometimes referred to as a "North bridge." The North bridge 106 also electrically couples to a main memory array 104 by a memory bus, and may further electrically couple to a graphics controller 108 via an advanced graphics processor ("AGP") bus. The main memory array 104 may be a magnetic memory array utilizing the disclosed methods for reducing the memory read time. The North bridge 106 couples CPU 102, memory 104, and graphics controller 108 to the other peripheral devices in the system through, for example, a primary expansion bus ("BUS A") such as a PCI bus or an EISA bus. Various components that operate using the bus protocol of BUS A may reside on this bus, such as an audio device 114, a IEEE 1394 interface device 116, and a network interface card ("NIC") 118. These components may be integrated onto the motherboard, as suggested by FIG. 13, or they may be plugged into expansion slots 110 that are connected to BUS A.

If other secondary expansion buses are provided in the computer system, another bridge logic device 112 may be used to electrically couple the primary expansion bus ("BUS A") to the secondary expansion bus ("BUS B"). This bridge logic 112 is sometimes referred to as a "South bridge." Various components that operate using the bus protocol of BUS B may reside on this bus, such as a hard disk controller 122, a system ROM 124, and Super I/O controller 126. Slots 120 may also be provided for plug-in components that comply with the protocol of BUS B.

Implementing multiple sample operations and utilizing a digital counter with reversible direction (i.e., an up/down counter) may reduce read times of magnetic memory. The count associated with each sample may be added or subtracted from each other by changing the direction of the counter, and the net count value may indicate the digital state of the memory element. By employing a reversible counter and coupling registers to this counter, sensing operations performed on multiple memory elements may be grouped together and performed prior to writing known values to these memory elements. By grouping the sensing operations and the writing operations associated with reading memory together, memory read time may be reduced. This read time may be further reduced if multiple memory elements may be written to simultaneously, as may be allowed in some memory configurations. In addition, registers may be coupled to the counter so that a net count value for multiple memory elements may be obtained by buffering the digital count values. Since self-referencing may involve modifying the contents of a memory element, restoring the memory elements to their initial value may be necessary. Memory elements may be selectively restored to their initial value by writing information from the registers. Selective restoration may further reduce the overall read time of the chip.

The above discussion is meant to be illustrative of the principles and various embodiments of the present invention. Numerous variations and modifications will become apparent to those skilled in the art once the above disclosure is fully appreciated. For example, although the memory elements are shown as resistive elements, the memory elements may be implemented with other circuit elements such as capacitors, inductors, diodes, and transistors. Also, although magneto-resistive memory elements were disclosed in conjunction with some of the embodiments of the invention, other memory devices with variable resistances may be implemented without departing from the scope of this disclosure. For example, "phase-change" memory elements, which undergo changes in their resistive state in response to varying intensities of light, may also benefit from the embodiments disclosed herein. It is intended that the following claims be interpreted to embrace all such variations and modifications.

What is claimed is:

1. A method for reading memory values, comprising:
   sampling a plurality of magnetic memory elements, wherein the memory elements contain unknown values;
   buffering the sampled values;
   writing known values to the plurality of memory elements;
   sampling the plurality of memory elements, wherein the memory elements contain known values; and
   comparing the known values to the buffered values.

2. The method of claim 1, further comprising restoring the initial unknown values to the memory elements.

3. The method of claim 2, wherein initial unknown values of memory elements are restored only if the known and unknown values do not match.

4. The method of claim 1, wherein sampling the memory element includes:
   regulating a voltage across a magnetic memory element; and
   correlating the resistance of a memory element to a digital count value using a digital counter.

5. The method of claim 4, wherein the count in the digital counter represents the difference between the known and unknown states of the memory element.

6. The method of claim 4, wherein the digital counter has a reversible direction.

7. The method of claim 1, wherein buffering is accomplished using registers.

8. The method of claim 7, wherein the registers include synchronous dynamic random access memory.

9. A method for reducing read time of memory values in magnetic memory array, comprising:
   (a) sampling an unknown state of a first memory element;
   (b) buffering this sampled value;
   (c) repeating (a) and (b) for subsequent memory elements;
   (d) writing a known value to the first memory element;
   (e) repeating (d) for the subsequent memory elements;
   (f) sampling the known value written to the memory elements; and
   (g) comparing the buffered value with the known value.

10. The method of claim 9, wherein sampling the memory element includes:
    regulating a voltage across a memory element; and
    correlating the resistance of a memory element to a digital count value using a digital counter;
    wherein the memory element comprises a magnetic memory element.

11. The method of claim 10, wherein the count in the digital counter represents the difference between the known and unknown states of the memory element.

12. The method of claim 11, wherein the digital counter is an up/down counter.

13. The method of claim 9, further comprising restoring the original unknown state to the memory elements.

14. A memory, comprising:
    a plurality of magnetic memory elements;
    a sense element coupled to the memory elements;
    a digital counter coupled to the sense element, wherein the count contained in the counter is related to the digital value of a memory element; and
    a plurality of registers coupled to the counter, wherein each register is configured to store a count value.

15. The memory of claim 14, further comprising an arithmetic logic unit for performing mathematical operations on the contents of the registers.

16. The memory of claim 14, wherein the counter contains the sum and difference of digital count values.

17. The memory of claim 14, wherein self-referencing techniques are employed to read the value of a memory element.

18. The memory of claim 14, wherein an unknown data value is represented by a first count of the digital counter, and this count is retained in the register.

19. The memory of claim 18, wherein a known data value is represented by a second count of the digital counter, and wherein the first and second counts are compared.

20. The memory of claim 19, wherein the second count is contained in a register and the comparison is performed using mathematical operations.

21. A method for reading memory values, comprising:
    coupling a digital counter to a memory element;
    associating a first digital count with an unknown data value contained in the memory element;
    retaining the first digital count;
    associating a second digital count with a known value contained in the memory element; and
    comparing the first and second digital counts.

22. The method of claim 21, wherein the first and second digital counts are retained in a register that is coupled to the digital counter.

23. The method of claim 21, wherein the first digital count is contained in the digital counter and the direction of the digital counter is reversed prior to associating the second digital count with the known value.

24. A computer system, comprising:
    a processor;
    a keyboard coupled to the processor; and
    a system memory coupled to the processor, wherein the memory comprises:

an array of memory elements;

sensing circuitry coupled to the memory elements;

counter circuitry coupled to the sensing circuitry, wherein the counter contains a count indicative of the digital value of a memory element; and a plurality of registers coupled to the counter capable of storing multiple count values.

25. The computer of claim 24, wherein the memory further comprises an arithmetic logic unit to perform mathematical operations on the contents of the registers.

26. A memory, comprising:

storage means for storing information;

sensing means for sensing the stored information;

counting means wherein the count in said counting means is related to the digital value of the stored information; and storage means for wherein the storage means is configured to store a count value.

* * * * *